United States Patent [19]

Lefferts

[11] 4,216,436

[45] Aug. 5, 1980

[54] HIGH GAIN DIFFERENTIAL AMPLIFIER

[75] Inventor: Peter Lefferts, San Martin, Calif.

[73] Assignee: National Semiconductor Corporation, Santa Clara, Calif.

[21] Appl. No.: 917,153

[22] Filed: Jun. 20, 1978

[51] Int. Cl.² .............................................. H03F 3/45
[52] U.S. Cl. ............................... 330/260; 307/299 B; 330/257; 330/261
[58] Field of Search ..................... 307/299 B; 330/252, 330/257, 261, 260

[56] References Cited

U.S. PATENT DOCUMENTS

| 3,673,508 | 6/1972 | Callahan, Jr. | 307/299 B X |
| 3,783,400 | 1/1974 | Gay | 307/299 B X |
| 4,147,944 | 4/1979 | Monticelli | 330/257 X |

*Primary Examiner*—James B. Mullins

*Attorney, Agent, or Firm*—Brown & Martin

[57] ABSTRACT

The disclosed amplifier includes first and second transistors each having an emitter coupled to a bias source, a base, a first collector and a second collector. A third transistor has a collector connected to another bias source, an emitter connected to the base of the first transistor and to the first collector of the second transistor, and a base for receiving input signals. A fourth transistor has a collector connected to another bias source, an emitter connected to the base of the second transistor and to the first collector of the first transistor, and a base for receiving second input signals. Any difference in voltage between the input signals is indicated by an imbalance in current through the second collectors of the first and second transistors. The first collectors of these transistors provide positive feedback for amplifying the magnitude of this imbalance.

14 Claims, 4 Drawing Figures

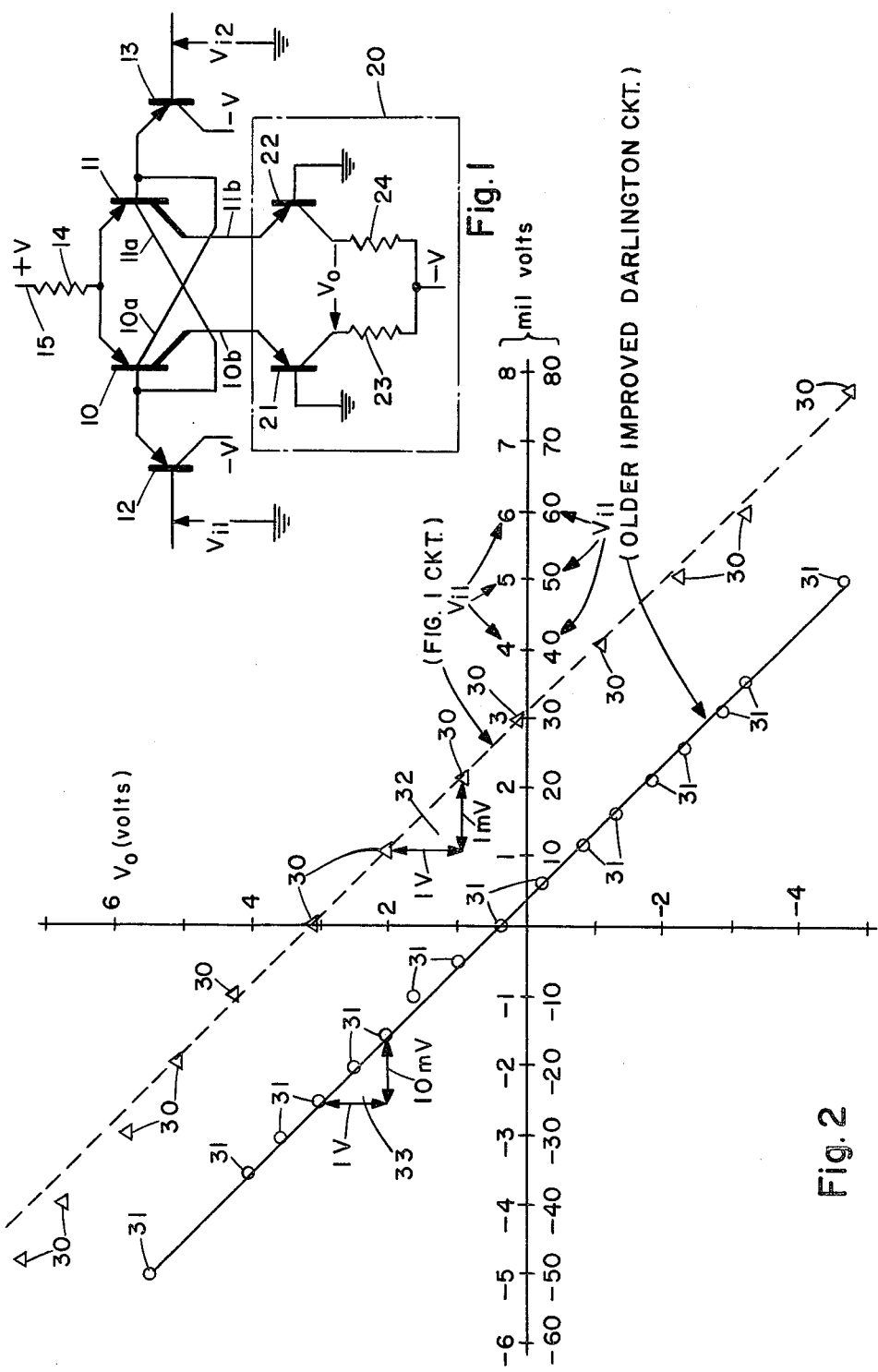

HIGH GAIN DIFFERENTIAL AMPLIFIER

BACKGROUND OF THE INVENTION

This invention relates to amplifiers and more particularly to high gain differential amplifiers and to their use in comparators. Differential amplifiers are known in the prior art which provide amplification of D.C. or low frequency signals over a wide temperature range. This wide range of operating temperature is achieved by making the amplifier symmetrical. Due to the symmetry, various temperature dependent error signals tend to cancel. Examples of these temperature dependent parameters include a transistor's current gain $\beta$, saturation current $I_{co}$, and base to emitter voltage $V_{be}$.

A variety of differential amplifiers exist in the prior art. One widely used circuit is called the Darlington amplifier. These and other differential amplifiers all have the desirable feature of being relatively insensitive to temperature changes. However, a disadvantage of the Darlington circuit and other known differential amplifiers is that they do not use positive feedback to improve their voltage gain. As a result, a single stage of amplification may give less gain than is desired. In comparison, by the teachings of this disclosure, the gain of a single stage Darlington differential amplifier can be increased by a factor of 10.

Accordingly, it is one object of the invention to provide an improved differential amplifier.

Another object of the invention is to provide a differential amplifier using positive feedback to increase its gain.

Another object of the invention is to provide a differential amplifier comprised of a pair of transistors for sensing any difference in voltage across their base to emitter junctions and for supplying collector currents to increase the voltage difference.

Still another object of the invention is to provide an improved comparator that includes a differential amplifier having positive feedback to increase its gain.

SUMMARY OF THE INVENTION

These and other objects are accomplished by the invention by a differential amplifier which includes four integrated PNP transistors. First and second ones of these transistors have two collectors while the third and fourth transistors have only one collector. The emitters at the first and second transistors connect together to a bias source. One collector of a first transistor and the base of the second transistor connect to the emitter of the fourth transistor. Similarly, one collector of the second transistor and the base of the first transistor connect to the emitter of the third transistor. These collectors provide positive feedback in the amplifier which increases its gain as described below. These collectors further provide stabilizing bias currents to the third and fourth transistors, thus limiting $V_{os}$ errors.

The other two collectors of the first and second transistors connect to an output circuit which generates an output voltage proportional to the difference in current in the collectors. Preferably, but not necessarily, these two collectors are larger than the ones that provide the positive feedback. Under a balanced condition, currents in these two collectors are equal to each other and the output voltage is zero. If the voltage on the base of the third transistor decreases from that which produces the balanced condition, the base to emitter voltage on the first transistor increases; and this in turn increases the emitter current of the first transistor, and decreases the emitter current of the second transistor. The decreased emitter current of the second transistor is fed back via one of the collectors to the third transistor. This feedback reduces the $V_{be}$ of the third transistor which produces a further increase in the emitter current of the first transistor.

Any difference in emitter current in the first and second transistor results in an amplified difference between the second collector currents from the respective transistors. The output circuit operates to generate an output voltage indicating the difference in second collector currents. Due to the above described feedback, a change in voltage on the base of the third or fourth transistors generates a change in output voltages which is approximately ten times greater than that of a conventional Darlington amplifier.

The above described embodiment may also be modified to use integrated NPN or discrete transistors. In these modified embodiments, a pair of single collector transistors preferably replaces each of the dual collector PNP transistors. The emitters and bases of each pair of transistors are connected in parallel, while the collectors are left separate and are individually connected as described above.

BRIEF DESCRIPTION OF THE DRAWING

The operation and various other aspects of the disclosed embodiment will best be understood by referring to the following drawings, when read in conjunction with the detailed description wherein:

FIG. 1 is a detailed circuit diagram of an amplifier constructed according to the invention.

FIG. 2 is a set of data points indicating the gain of the FIG. 1 circuit in comparison with a Darlington circuit.

DETAILED DESCRIPTION OF THE PREFERRED EMBODIMENTS

Figures 3, 4:
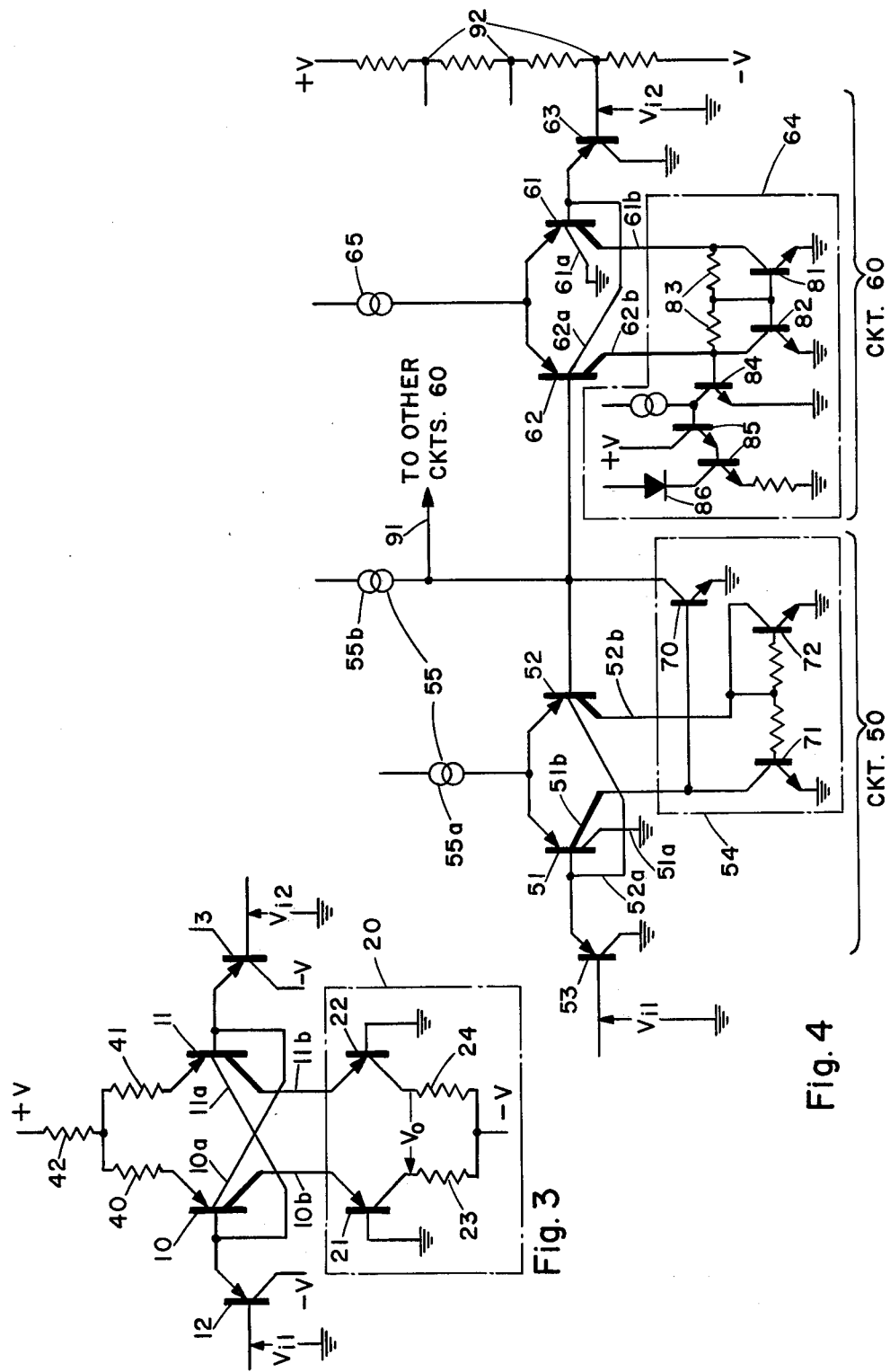
FIG. 3 is a detailed circuit diagram of another amplifier constructed according to the invention.
FIG. 4 is a detailed circuit diagram of a comparator which is also constructed according to the invention.

Referring now to FIG. 1, a first embodiment of the invention will be described. This embodiment includes four bipolar transistors 10, 11, 12 and 13. Transistors 10 and 11 each have an emitter connected to a resistor 14. This resistor has a terminal 15 for applying a bias voltage $+V$ thereto. Transistors 10 and 11 also each include two collectors 10a, 10b and 11a, 11b respectively. Collector 10a of transistor 10 connects to the emitter of transistor 13; while the collector 10b connects to an output circuit 20. Similarly, collector 11a of transistor 11 connects to the emitter of transistor 12; while collector 11b connects to output circuit 20. Collectors 10a and 11a are physically reduced in size to carry only approximately one-tenth of total collector current.

Transistor 12 further includes a base for receiving input signals $V_{i1}$, and includes a collector connected to a bias voltage $-V$. Similarly, transistor 13 includes a base for receiving input signals $V_{i2}$, and a collector connected to a bias voltage $-V$.

In operation, the FIG. 1 circuit generates currents in collectors 10b and 11b indicating any voltage difference between the base of transistors 12 and 13. Circuit 20 converts the current in collectors 10b and 11b to an output voltage V0. This voltage is an amplification of the voltage difference between the base of transistors 12 and 13. The amount of amplification that is generated is substantially increased due to feedback currents in collectors 10a and 11a. Details of this feedback action and the resulting gain increase will be described shortly.

In the FIG. 1 embodiment, output circuit 20 consists of transistors 21 and 22, and resistors 23 and 24. Transistor 21 has an emitter connected to collector 10b, and a collector coupled through resistor 23 to a bias voltage −V. Similarly, transistor 22 has an emitter connected to collector 11b, and a collector connected through resistor 24 to bias voltage −V. The base of transistors 21 and 22 is connected to ground.

From the above description, and by inspection of FIG. 1, it is clear that the disclosed circuit is symmetrical. Transistors 10 and 12 for example, are the mirror image of transistors 11 and 13. Accordingly, various temperature dependents parameters in the circuit, such as $\beta$, $V_{be}$, and $I_{co}$ cancel out. Thus, the output voltage V0 remains constant for constant input signals over a wide range of temperature.

In addition, the circuit of FIG. 1 has positive feedback which improves its gain over the prior art. The manner in which this gain improvement is achieved may be understood by considering the state of the currents and voltages in the circuit when the input voltages are approximately equal; and by considering the change in these currents and voltages which occur when one of the input voltages changes.

Under a perfectly balanced condition, the currents in collectors 10b and 11b are equal. By symmetry, this condition will occur when the input voltages on the base of transistors 12 and 13 are within a few millivolts of each other. Also by symmetry, under the balanced conditions where the currents and collectors 10b and 11b are equal, the base to emitter voltage drop of transistors 10 and 11 are approximately equal to each other, and the base to emitter voltage of transistors 11 and 12 are also approximately equal to each other.

Consider now the changes which occur when the input voltage $V_{i1}$ on the base of transistor 12 slightly decreases. In response thereto, the base to emitter voltage of transistor 10 increases slightly. As a result, the emitter current of transistor 10 increases. This in turn decreases the emitter current of transistor 11 because the total current supplied through resistor 14 to the emitters of transistors 10 and 11 is approximately constant. In response to the emitter current of transistor 11 decreasing, the current in collector 11a decreases; and as a result, the emitter current in transistor 12 decreases. Due to the latter, the base to emitter voltage of transistor 12 decreases; and this voltage decrease causes a further increase in the base to emitter voltage of transistor 10.

The above described sequence of changes illustrates that current in collector 11a provides positive feedback to the circuit. When input voltage $V_{i1}$ decreases and causes the base to emitter voltage of transistor 10 to increase, the positive feedback actually causes the base to emitter voltage of transistor 12 to decrease, which in turn causes the base to emitter voltage on transistor 10 to further increase. For example, a three millivolt decrease in signal $V_{i1}$ typically results in a five millivolt increase in the base to emitter voltage of transistor 10, and a two millivolt decrease in the base to emitter voltage of transistor 12. Of course, the increased base to emitter voltage of transistor 10 results in an increase in current in collector 10b, which in turn is converted to an increased output voltage V0 by output circuit 20.

Positive feedback is also supplied in the disclosed circuit by current in collector 10a. Consider again for example, the situation where input signal $V_{i1}$ decreases slightly from the balanced condition. In response, the base to emitter voltage of transistor 10 increases slightly; and this in turn increases both the emitter current of transistor 10 and the current in collector 10a. As a result, the emitter current in transistor 13 increases; and thus the base to emitter voltage of transistor 13 increases. In response, the base to emitter voltage of transistor 11 decreases. This decreases the emitter current of transistor 11, which in turn increases the emitter current of transistor 10. This imbalance in emitter currents results in a further increase in output voltage V0.

FIG. 2 is a set of data points illustrating the improved gain which is produced by the disclosed circuit. Included therein are data points 30 which represent actual data taken from testing the FIG. 1 circuit. In this test, signal $V_{i2}$ was ground; resistors 14, 23 and 24 were each 68 K ohms; voltage +V was +15 volts; and voltage −V was −15 volts. Also included are data points 31 which were obtained by testing the exact same circuit but with collector 10a connected to the emitter of transistor 12 and collector 11a connected to the emitter of transistor 13. Such a circuit has been described in the past and is herein referred to as an older improved Darlington differential amplifier.

As FIG. 2 illustrates however, the gain of the disclosed circuit is substantially greater than the gain of the older improved Darlington amplifier. For example, in the disclosed circuit, a change of one millivolt in input voltage $V_{i1}$ results in a change on one volt in output voltage V0. This is illustrated at 32 in FIG. 2. In comparison, a change of ten millivolts in input signal is required in the older improved Darlington circuit to produce a one volt change at the output. This is illustrated at 33 in FIG. 2. Thus the disclosed circuit has a gain which is ten times greater than that of the improved Darlington circuit.

Referring now to FIG. 3, a second embodiment of the invention will be described. This embodiment is quite similar to the embodiment of FIG. 1, and like parts are identified with like reference numerals. The only difference between the FIG. 1 and FIG. 3 embodiments is in the biasing circuits for the emitters of transistors 10 and 11. In the FIG. 3 embodiment, resistors 40 and 41 connect respectively to the emitters of transistors 10 and 11, and connect through a third resistor 42 to a bias voltage +V.

Resistor 42 in combination with the voltage +V acts similar to the resistor 14 of the first embodiment to supply a relatively constant current to transistors 10 and 11. Suitably, resistor 42 is 68 K ohms. In comparison, resistors 40 and 41 are relatively small. Their value is chosen to slightly reduce the base to emitter voltage which occurs in response to an offset in the input signals $V_{i1}$ and $V_{i2}$. In other words, resistors 40 and 41 provide a negative feedback which partially counteracts the positive feedback that collectors 10a and 11a provide. Due to this negative feedback, the gain of the FIG. 3 circuit will lie somewhere between the gain of the FIG. 1 circuit and that of the older improved Darlington circuit. The actual gain is of course dependent on the value of resistances 40 and 41. Setting resistors 40 and 41 to 30 ohms for example, causes the circuit of FIG. 3 to have a gain of approximately three times the older improved Darlington circuit.

By including resistors 40 and 41 in the circuit, the relation between the input signals and the output signals remains linear over a larger range of input voltage. For example, with resistors 40 and 41 equal to 30 ohms, the output signal V0 varies linearily with the input signal over a range of approximately one hundred millivolts. In comparison, without resistors 40 and 41, the input and output voltages vary in a linear fashion over a range of approximately fifteen millivolts.

A third embodiment of the invention will now be described in conjunction with FIG. 4. This embodiment operates as a comparator. Included within the comparator of FIG. 4 are two symmetrical circuits 50 and 60. Due to this symmetry, various temperature dependent parameters in the comparator tend to cancel. As a result, the comparator operates properly over a wide range of temperature.

In addition, the FIG. 4 comparator includes positive feedback similar to that described in conjunction with FIGS. 1 and 3. Due to this feedback, the gain of circuit 60 is substantially improved. As a result, the comparator is substantially more sensitive to changes in the input signal $V_{i1}$ than are conventional comparators.

Included within circuit 50 are transistors 51 and 52. Similarly, circuit 60 includes transistors 61 and 62. Each of these transistors 51,52,61,62 have two collectors. A collector 62a provides positive feedback in circuit 60 by connecting to the emitter of a transistor 63. This feedback in turn, increases the gain of circuit 60.

Similarly, a collector 52a in circuit 50 connects to the emitter of a transistor 53. This connection however, is included for symmetry purposes only. That is, circuit 50 operates only as a buffer, and thus does not require high gain.

Also included within circuits 50 and 60 respectively are output circuits 54 and 64. Circuit 54 connects to collectors 51b and 52b; and it generates an analog voltage at the base of transistors 52 and 62 proportional to any current difference in the collectors. In comparison, circuit 64 connects to collectors 61b and 62b; and it generates a digital voltage V0 indicating which of the collectors 61b and 62b are carrying the larger current.

Circuits 50 and 60 also include current sources 55 and 65 respectively. Preferably, each of these current sources supply identical currents. This maintains the symmetry within the FIG. 4 comparator. For example, when signals $V_{i1}$ and $V_{i2}$ are approximately equal, the emitter current in transistors 51,52,61, and 62 will be equal to each other. Suitably, the current sources each supply 20 microamps, and the emitter currents of transistors 51,52,61 and 62 under a balanced condition are each 10 microamps.

The impedances at collectors 51b and 52b under a balanced input condition also are symmetrical to each other. Collector 51b drives the base of a transistor 70 carrying 20 microampiers and the collector of a transistor 71 carrying 10 microampiers. Similarly, collector 52b drives the base of transistors 71 and 72 which have a combined collector current of 20 microampiers, and the collector of transistor 72 which carries 10 microampiers. Thus under balanced input conditions, the impedance and division of currents at collectors 51b and 52b will be nearly identical over a wide range of temperature.

Under the condition where $V_{i1}$ equal $V_{i2}$, the current through collectors 52a and 62a will be identical to each other. Similarly, the current in collectors 51a and 61a are identical to each other. These latter two collectors are included only to make the structure of transistors 51, 52, 61 and 62 identical. Collectors 51a and 61a are simply connected to ground to divert a small amount of the emitter current away from collectors 51b and 61b respectively. This makes transistors 51, 52, 61 and 62 not only physically identical, but also matched in operation over a wide range of temperature.

Consider now the operation of the FIG. 4 comparator when signal $V_{i1}$ is out of balance with signal $V_{i2}$. A decrease in signal $V_{i1}$ produces an increase in the base to emitter voltage of transistor 51. This in turn generates an increase in the emitter current of transistor 51. As a result, the emitter current of transistor 52 should decrease as was previously described in conjunction with FIGS. 1 and 3. In the FIG. 4 circuit however, collector 51b drives the base of transistor 70; and an increase in current in collector 51b produces a decrease in the collector voltage of transistor 70. This in turn increases the base to emitter voltage of transistor 52 which tends to increase the current in the emitter of transistor 52. The net effect is that circuit 50 operates not as a high gain amplifier, but as a unity gain buffer having its output signals on the collector of transistor 70.

In comparison, circuit 60 does operate as a high gain amplifier which uses positive feedback, as was previously described in conjunction with FIGS. 1 and 3. For example, a decrease in the collector voltage of transistor 70 produces an increase in the base to emitter voltage of transistor 62. As a result, the emitter current of transistor 62 increases; which in turn increases the current in collector 62a. This increases the emitter current in transistor 63, which increases the base to emitter voltage of transistor 63, which decreases the base to emitter voltage of transistor 61. Thus, the emitter current of transistor 61 decreases which in turn causes a further increase in the emitter current of transistor 62. The net result is positive feedback. This gives circuit 60 a gain of approximately three times that of a circuit similar to circuit 60 but with collector 62a removed. Further, the feedback does not cause latching or oscillations.

Output circuit 64 operates to detect a difference in current in collectors 61b and 62b. This circuit includes a pair of transistors 81 and 82 having collectors connected to the collectors 61b and 62b respectively. The base of transistors 81 and 82 are connected together and are further connected to collectors 61b and 62b through a center taped resistor 83.

Since the base to emitter voltage of transistors 81 and 82 is identical, these transistors always carry identical current. For example, they each carry ten microampiers of collector current when current source 65 supplies 20 microampiers. Whenever collector 62b carries more current than collector 61b, current flows through resistor 83 such that the collector of transistors 81 and 82 still draw equal amounts of current. This flow of current through resistor 83 forward biases the base to emitter junction of a transistor 84. As a result, transistor 84 turns on and sinks current away from a switching amplifier 85. Conversely, whenever collector 61b carries more current than collector 62b, current flows in an opposite direction through resistor 83. This in turn reverse biases the base to emitter junction of transistor 84. In response, transistor 84 turns off and allows the flow of current through switching amplifier 85. This switching amplifier in turn drives a light emitting diode 86.

As one preferred modification to the FIG. 4 circuit, a plurality of the circuits 60 are connected in parallel to the collector of transistor 70. This is indicated at 91. In this modified circuit, each of the transistors 63 within the various circuits 60 have a different input voltage $V_{i2}$. Preferably, this input voltage is generated by a resistive voltage divider having a number of taps as indicated at 92. Thus, in this embodiment, as voltage $V_{i1}$ is sequentially increased, the light emitting diodes 86 in the various circuits 60 sequentially indicate the tapped voltage $V_{i2}$ which compares with the input voltage $V_{i1}$.

Various other changes and modifications can also be made to the disclosed circuits without departing from the nature and spirit of the invention. For example, each of the PNP transistors that are illustrated in any of the Figures may be replaced by an NPN transistor and vice versa. Such a change must also be accompanied by a change in polarity of the illustrated biasing voltages or current sources. As another alternative, each of the transistors illustrated as having two collectors may be replaced by a pair of transistors, each of which has only one collector. In this modified embodiment, the emitters and the bases of the pair of transistors are connected together, while the individual collectors are connected in the same manner as are the collectors of the illustrated dual collectors transistors. The term composite transistor is herein generally defined to mean any of the above described alternative dual collector transistor configurations.

Therefore, since many changes and modifications can be made to the disclosed detailed embodiments without departing from the nature and spirit of the invention, it is to be understood that the invention is not limited to these details but is defined by the appended claims.

I claim:

1. An amplifier comprising:
    first and second composite transistors each having an emitter coupled to a means for biasing, a base, a first collector, and a second collector;
    a third transistor having a collector coupled to another means for biasing, an emitter coupled to said base of said first transistor, and a base for receiving input signals;
    a fourth transistor having a collector coupled to said another means for biasing, an emitter coupled to said base of said second transistor, and a base for receiving second input signals; and
    first resistive means coupled to receive current from said second collector of said first composite transistor, and second resistive means coupled to receive current from said second collector of said second composite transistor for generating a voltage across said resistive means proportional to any difference in current through said second collectors;
    wherein said first collectors of said first and second transistors are respectively coupled to said emitters of said fourth and third transistors for positively feeding back changes in emitter current in said first and second transistors respectively to change the base-to-emitter voltages in said fourth and third transistors respectively to thereby increase the magnitude of the changes in the emitter currents in said first and second transistors respectively and amplify said difference in current through said second collectors.

2. An amplifier according to claim 1, wherein said first and second composite transistors are dual collector PNP transistors, and said third and fourth transistors are single collector PNP transistors.

3. An amplifier according to claim 1, wherein said first and second composite transistors each are a pair of single collector NPN transistors, and said third and fourth transistors are single collector NPN transistors.

4. An amplifier according to claim 1, further comprising said means for biasing that is coupled to said emitters of said first and second transistors, wherein said means consists of a single resistor having one terminal connected to said emitters and another terminal connected to a bias voltage lead.

5. An amplifier according to claim 1, further comprising said means for biasing that is coupled to said emitters of said first and second transistors, wherein said means consists of first and second resistors respectively connected to said emitters, and a third resistor connecting said first and second resistors to a bias voltage lead.

6. An amplifier according to claim 1, wherein said first and second resistive means each consist of a resistor and a transistor, said transistor having a collector connected through said resistor to a bias voltage lead, a base coupled to a bias voltage lead, and an emitter connected to one of said second collectors.

7. An amplifier according to claim 1, wherein said first and second resistive means each consists of a resistor connected between a bias voltage lead and one of said second collectors.

8. A comparator according to claim 1 wherein said first and second resistive means each consist of a resistor and a transistor, said resistors being coupled across the collector and base of one of said transistors, and said transistors having a collector coupled to one of said second collectors and having an interconnected base.

9. A comparator comprised of;
    first and second circuits, each of said circuits including: first and second composite transistors each having an emitter coupled to a means for biasing, a base, a first collector and a second collector, a third transistor having a collector coupled to a means for biasing, an emitter coupled to said base of said first transistor and to said first collector of said second transistor, and a base for receiving input signals; and means for biasing said first collector of said first transistors;
    said first circuit further including output means coupled to said second collector of said first and second transistors in said first circuit for generating a voltage at the base of said second transistor proportional to any current difference in said second collectors; and
    said second circuit further including first resistive means coupled to receive current from said second collector of said first transistor, and second resistive means coupled to receive current from said second collector of said second transistor, for generating a voltage across said resistive means having a polarity indicating which of said second collectors is carrying the larger current.

10. A comparator according to claim 9, and further including a plurality of said second circuits with the base of said second transistor in each of said second circuits coupled to the base of said second transistor in said first circuit.

11. A comparator according to claim 10, and further including means for dividing an analog reference voltage into a plurality of intermediate analog voltages respectively connected to the base of said third transistors in each of said second circuits.

12. A comparator according to claim 9, wherein said first and second composite transistors are dual collector PNP transistors.

13. A comparator according to claim 9, wherein said first and second composite transistors each are a pair of single collector NPN transistors.

14. An amplifier according to claim 1, further comprising said means for biasing that is coupled to said emitters of said first and second transistors, wherein said means is a constant current source.

* * * * *